(12) United States Patent
Eriksen et al.

(10) Patent No.: US 9,583,901 B2
(45) Date of Patent: Feb. 28, 2017

(54) FIELD DEVICE USING A SEAL BOARD ASSEMBLY

(71) Applicant: Rosemount Inc., Chanhassen, MN (US)

(72) Inventors: Christopher Eriksen, St. Paul, MN (US); Michael Barth, Bloomington, MN (US)

(73) Assignee: Rosemount Inc., Chanhassen, MN (US)

( * ) Notice: Subject to any disclaimer, the term of this patent is extended or adjusted under 35 U.S.C. 154(b) by 172 days.

(21) Appl. No.: 14/501,321

(22) Filed: Sep. 30, 2014

(65) Prior Publication Data

US 2016/0093997 A1  Mar. 31, 2016

(51) Int. Cl.
| | |
|---|---|
| H01R 25/00 | (2006.01) |
| H01R 13/52 | (2006.01) |
| H05K 3/34 | (2006.01) |
| H01R 9/24 | (2006.01) |
| H05K 7/02 | (2006.01) |
| H01R 12/58 | (2011.01) |
| H01R 13/719 | (2011.01) |
| H01R 12/55 | (2011.01) |

(52) U.S. Cl.
CPC ......... *H01R 25/006* (2013.01); *H01R 9/2466* (2013.01); *H01R 12/585* (2013.01); *H01R 13/5202* (2013.01); *H05K 3/3447* (2013.01); *H05K 7/026* (2013.01); *H01L 2224/73265* (2013.01); *H01R 12/55* (2013.01); *H01R 13/719* (2013.01)

(58) Field of Classification Search
CPC ................. H05K 7/026; H05K 3/3447; H05K 2201/10303; H01R 9/2466; H01R 12/585
USPC .......................................... 439/949, 76.2, 271
See application file for complete search history.

(56) References Cited

U.S. PATENT DOCUMENTS

| | | | | |
|---|---|---|---|---|
| 5,490,785 | A | * | 2/1996 | Hein ................... H01R 13/6658 439/587 |
| 5,538,433 | A | * | 7/1996 | Arisaka ................ H05K 1/0218 174/266 |
| 7,190,053 | B2 | | 3/2007 | Orth et al. |
| 2002/0090846 | A1 | * | 7/2002 | Abboud ................... G06F 1/184 439/76.1 |
| 2005/0072242 | A1 | | 4/2005 | Fandrey |

(Continued)

FOREIGN PATENT DOCUMENTS

WO    WO9637764 A1    11/1996

OTHER PUBLICATIONS

Written Opinion and International Search Report, for PCT Application No. PCT/US2015/053208, Jan. 8, 2016, 12 pages.

*Primary Examiner* — Abdullah Riyami
*Assistant Examiner* — Justin Kratt
(74) *Attorney, Agent, or Firm* — Kinney & Lange, P.A.

(57) ABSTRACT

A seal board includes a circuit board with vias, conductor pins, and solder joints. The solder joints connect and seal each conductor pin to a single via, such that each conductor pin extends through the via and extends from a first side of the circuit board and a second side of the circuit board. The seal board is mounted to cover an opening in a bulkhead that separates a first compartment (such as a terminal block compartment) from a second compartment (such as an electronics or feature board compartment). The seal board provides electrical paths between the compartments while protecting components within one of the compartments from the surrounding environment.

16 Claims, 4 Drawing Sheets

(56) References Cited

U.S. PATENT DOCUMENTS

| | | |
|---|---|---|
| 2005/0284227 A1 | 12/2005 | Broden et al. |
| 2006/0055006 A1* | 3/2006 | Orth .................... H05K 1/0218 |
| | | 257/659 |
| 2007/0138602 A1 | 6/2007 | Orth et al. |
| 2008/0229838 A1 | 9/2008 | Kleven et al. |
| 2009/0139346 A1 | 6/2009 | Klosinski et al. |

* cited by examiner

FIELD DEVICE USING A SEAL BOARD ASSEMBLY

BACKGROUND

The present invention relates generally to field devices for use in industrial processes. In particular, this invention relates to a seal board for a field device such as an industrial process pressure transmitter.

Pressure transmitters may be mounted near a process and may be used to measure a fluid pressure related to an industrial process. Pressure transmitters can also be used to indirectly measure other parameters, such as velocity, fluid height, altitude, and fluid flow. The measured process fluid pressure can be sent to a host computer, a controller or other devices to ensure that the industrial process is monitored and controlled.

Some pressure transmitters have enclosures that are divided into two compartments, a terminal block compartment for terminal block components and an electronics compartment for active electronic assemblies (feature boards) separated by a bulkhead. The terminal block compartment allows a user access to electrical connections at the terminal block, while the electronics compartment protects the feature board(s) from the surrounding environment. Signals from one compartment are passed through the bulkhead to the other compartment. There is a need to electrically isolate the signals and limit any outside electronic noise (EMI) from entering the electronics compartment while still providing an environmental seal between the two compartments. In particular, a cost effective method is desired to pass higher numbers (i.e., a higher density) of individual electrical signals through the bulkhead while still providing electrical isolation from one another and the housing seal. One current technique for reducing EMI noise uses a complex stamped brazed radio frequency interference (RFI) filter tub assembly using metal stamping, ceramic filter bodies, and epoxy potting. This stamped brazed RFI filter tub assembly is difficult and costly to manufacture. Another alternative uses individual screw-in filter assemblies.

SUMMARY

In one embodiment, a seal board includes a circuit board, conductor pins, and solder joints. The circuit board includes a first side, a second side, a perimeter, and vias. The solder joints connect and seal each conductor pin to a single via such that each conductor pin extends through the via and extends from a first side of the circuit board and a second side of the circuit board.

Another embodiment is a transmitter used to sense and measure a process parameter, and communicate the information to a controller. The transmitter includes a housing and a seal board. The housing includes a first compartment, a second compartment, a bulkhead separating the first and second compartments, and an opening in the bulkhead between the first and second compartments. The seal board is located so that it covers and seals the opening between the first and second compartments. The seal board includes a circuit board, conductor pins, and solder joints. The circuit board includes a first side, a second side, a perimeter, and vias. Each conductor pin has a first end that extends from the first side of the circuit board and a second end that extends from the second side of the circuit board. The solder joints connect and seal each conductor pin to a single via such that each conductor pin extends through the via and extends from a first side of the circuit board and a second side of the circuit board.

DETAILED DESCRIPTION

Figure 1:
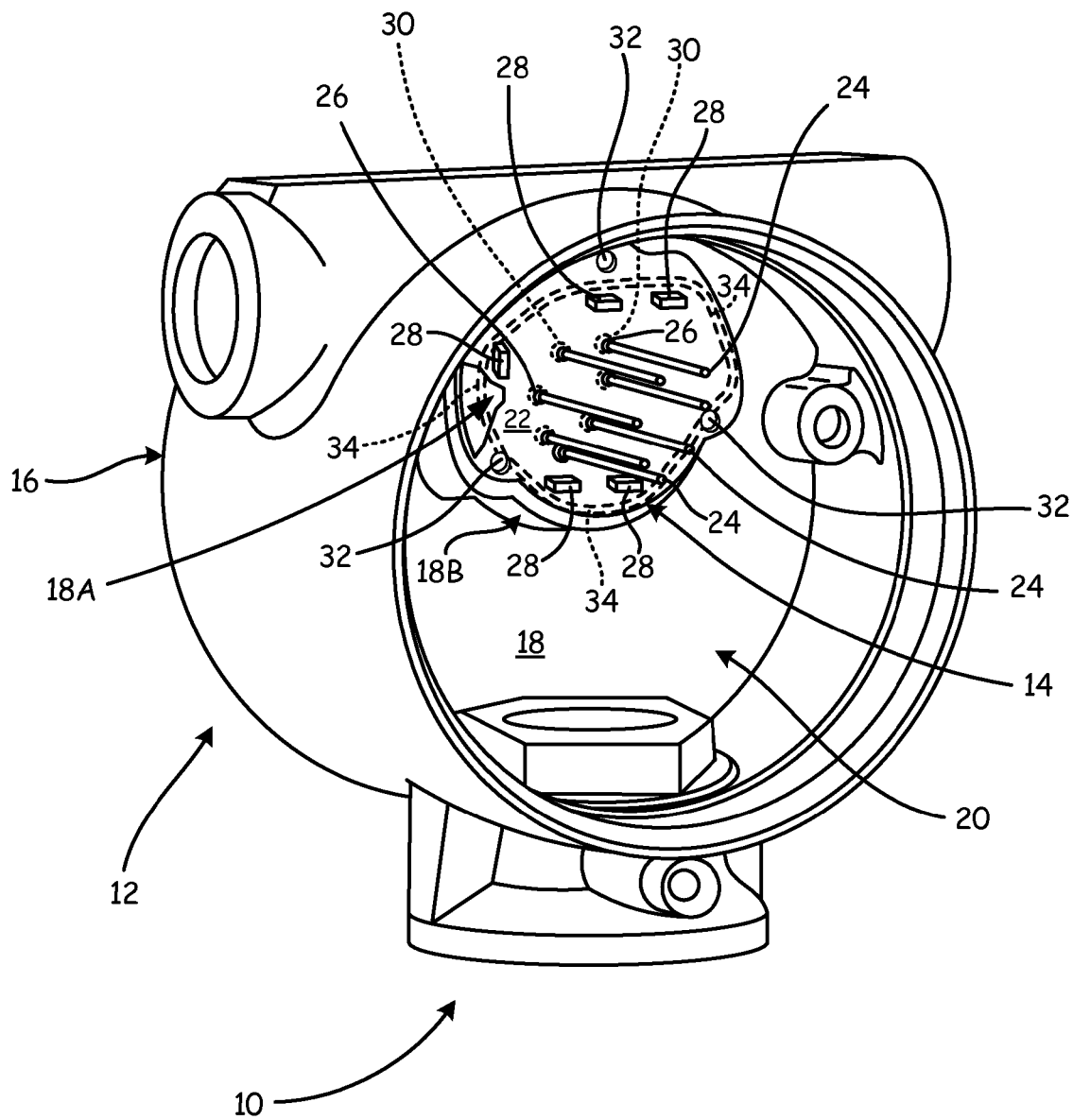
FIG. 1 is a perspective view of a transmitter.
Figure 2:
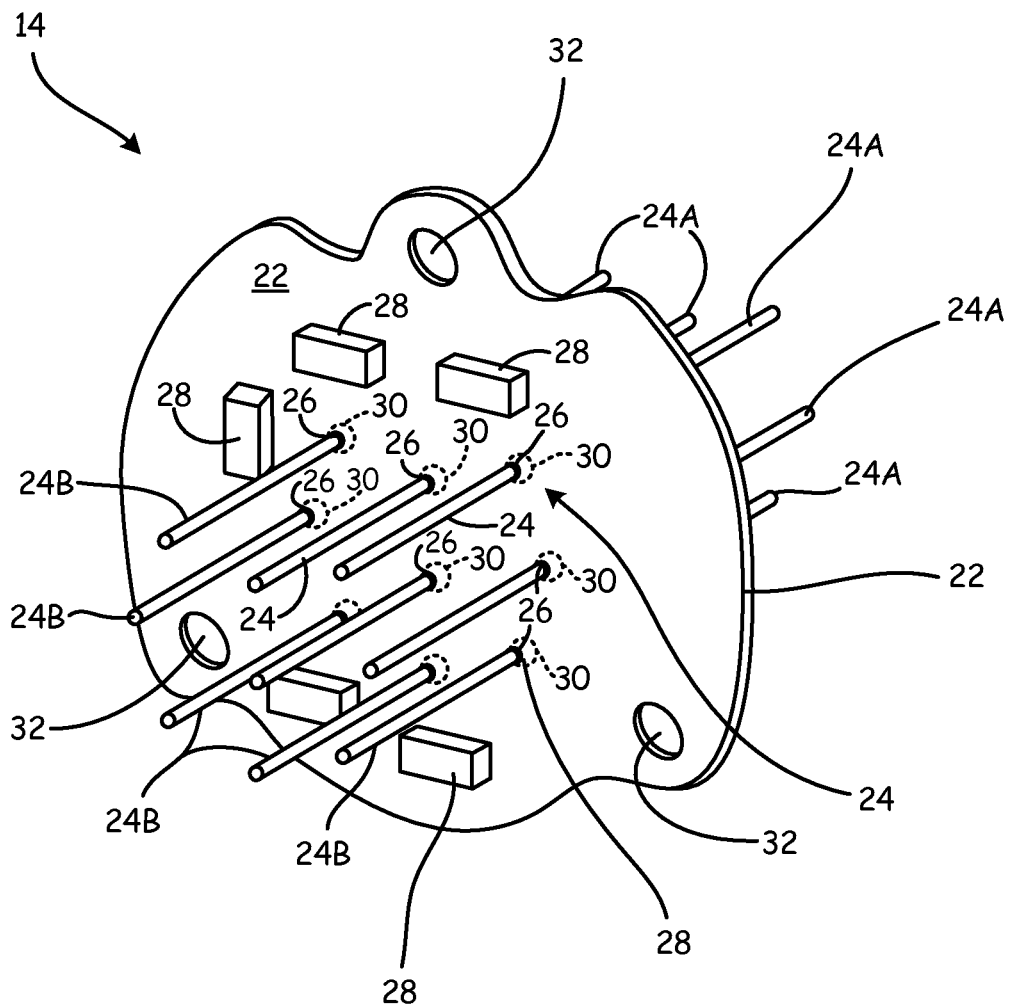
FIG. 2 is a perspective view of the seal board of the transmitter in FIG. 1.

FIG. 1 is a perspective view of transmitter 10, which includes housing 12 and seal board 14 according to one embodiment of the invention. FIG. 2 is a perspective view of seal board 14 separate from transmitter 10. FIGS. 1 and 2 will be discussed together.

Pursuant to this embodiment, housing 12 includes a first compartment (terminal block compartment 16), a partition wall (bulkhead 18 with opening 18A and neck 18B), and a second compartment (electronics or feature board compartment 20). Covers that attach to housing 12 to close compartments 16 and 20 have been removed and are not shown in FIG. 1.

Seal board 14 includes printed circuit board 22, conductor pins 24, solder joints 26, and capacitors 28. Circuit board 22 includes vias 30 (shown in phantom in FIGS. 1 and 2), and anchor holes 32.

Bulkhead 18 separates terminal block compartment 16 and feature board compartment 20. Neck 18B of bulkhead 18 extends into feature board compartment 20 and has opening 18A at its distal end. In the embodiment shown in FIG. 1, seal board 14 is mounted on the distal end of neck 18B such that it covers opening 18A of bulkhead 18. In FIG. 1, a portion of seal board 14 is broken away to show opening 18A. O-ring 34 is located between seal board 14 and neck 18B of bulkhead 18 about the perimeter of seal board 14 to environmentally seal terminal block compartment 16 from feature board compartment 20. Anchor holes 32 are located in a perimeter of seal board 14 and can be used with corresponding mating holes in bulkhead 18 to secure seal board 14 to bulkhead 18 using screws, rivets, or other fasteners. Vias 30 are located about the center region of seal board 14, within circuit board assembly 22. Solder joints 26 connect and seal each conductor pin 24 to a single via 30 such that each conductor pin 24 extends through via 30. Solder joints 26 both physically anchor and environmentally seal conductor pins 24 to seal board 14. The printed circuit board material of seal board 14 allows pins 24 to be electrically isolated from one another and from housing 12.

Capacitors 28 on printed circuit board 22 are surface-mount (SMD) chip capacitors which provide EMI filtering. This filtering prevents unwanted signal noise from passing between compartments 16 and 20 and effecting the performance of electronic assemblies within compartment 20 (feature boards, etc.).

When transmitter 10 is in use, pressure is sensed by a pressure sensor (not shown) that is located in feature board compartment 20. Electrical sensor signals from the pressure sensor are then passed from the feature board compartment 20 through seal board 14 to terminal block compartment 16.

Figure 3:
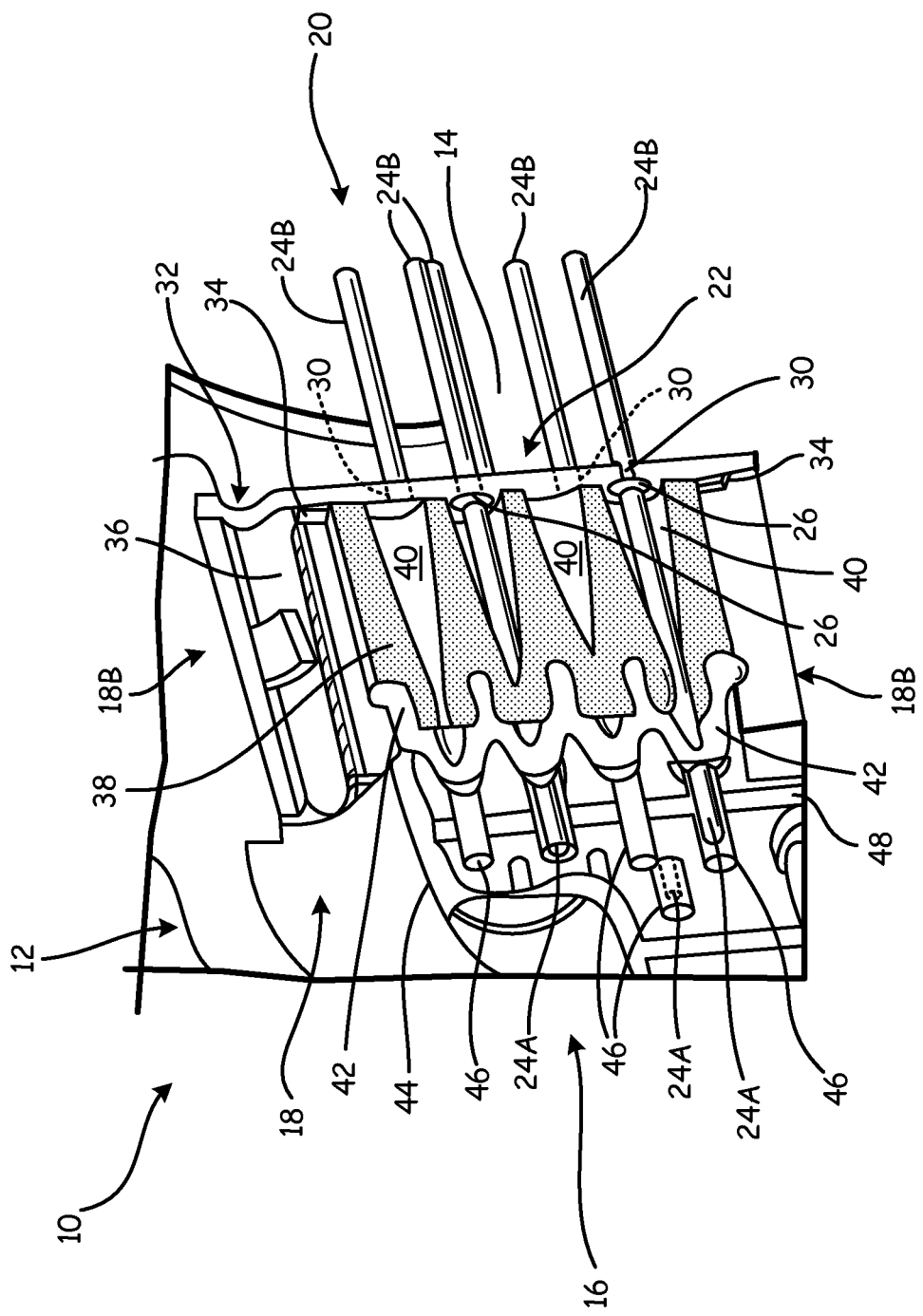
FIG. 3 is a cross-sectional view showing the seal board mounted to the housing bulkhead of the pressure transmitter in FIG. 1.

This is achieved by passing the electrical signals through conductor pins 24 that extend through vias 30. As shown in FIGS. 2 and 3, conductor pins 24 have first ends 24A extending into terminal compartment 16 and second ends extending into feature board compartment 20.

According to one embodiment, seal board 14 environmentally seals terminal block compartment 16 from feature board compartment 20. This, combined with conductor pins 24 that are sealed into place by solder joints 26, allows for the electronic signals to be passed between compartments 16 and 20 without allowing the environmental conditions in one compartment to affect electrical components in the other compartment. This design provides a cost effective method to pass higher numbers of individual electrical signals through bulkhead 18, while still providing an environmental seal to ensure accurate and precise measurements, and allowing for attachments that provide other functions, such as EMI filtering.

FIG. 3 is a cross-sectional partial view of transmitter 10 showing seal board 14 in housing 12. Transmitter 10 includes housing 12 and seal board 14. Housing 12 includes terminal block compartment 16, bulkhead 18, and feature board compartment 20. Bulkhead 18 includes bulkhead mating holes 36, which align with anchor holes 32 of seal board 14. Seal board 14 includes circuit board 22, conductor pins 24, solder joints 26, and surface mount capacitors 28. Circuit board 22 includes vias 30, and anchor holes 32. Solder joints 26 connect and seal each conductor pin 24 to a single via 30 such that each conductor pin 24 extends through via 30 with first end 24A of each conductor pin 24 extending from a first side of the circuit board 22 toward terminal block compartment 16, and second end 24B of each conductor pin 24 extending from a second side of the circuit board 22 toward feature board compartment 20. This arrangement allows signals to be passed between terminal block compartment 16 and feature board compartment 20, while still providing an environmental seal. Adapter fitting 38 is placed in neck 18B of bulkhead 18 and receives ends 24A of conductor pins 24. Adapter fitting 38 includes pin guides 40 and adapter cap 42. Terminal block 44 includes pin receivers 46 and circuit board 48 that holds and provides electrical connections to pin receivers 46. Pin guides 40 and adapter cap 42 protect and guide conductor pin ends 24A of conductor pins 24 to pin receivers 46 in terminal block 44. Adapter fitting 38 allows seal board 14 to connect to terminal blocks 44 of varying dimensions.

Figure 4A:
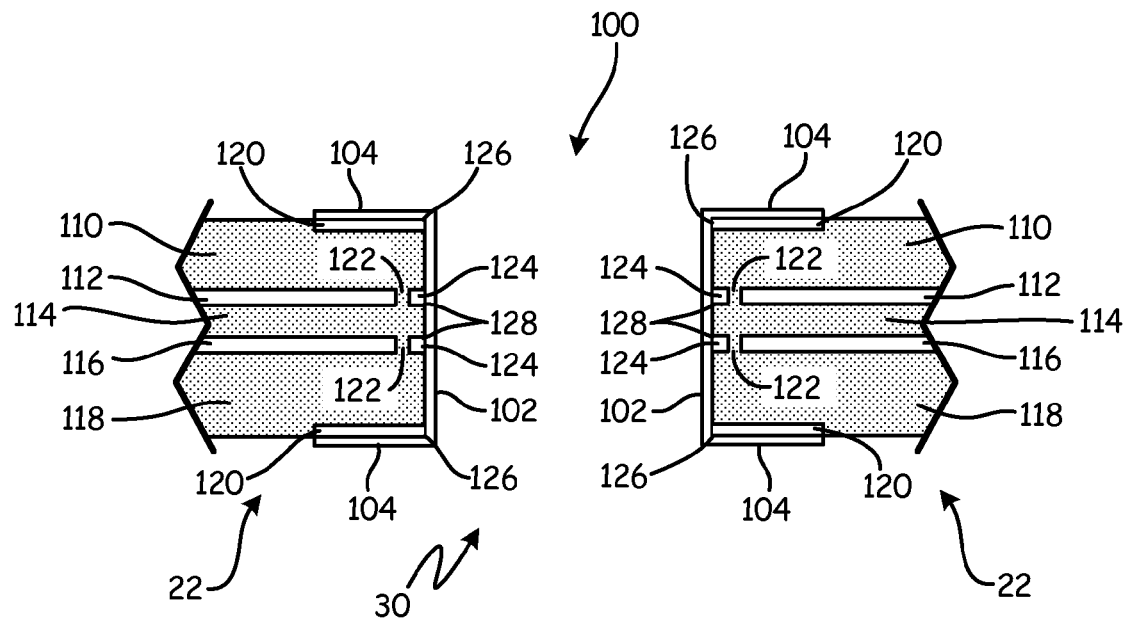
FIG. 4A is a cross-sectional view of a via.

FIG. 4A is a cross-sectional view of via 30 in multilayer circuit board 22. In the embodiment shown, via 30 includes through-hole 100, plated barrel 102, and conductive pads 104. Multilayer circuit board 22 includes first insulating material layer 110, first embedded ground plane 112, second insulating material layer 114, second embedded ground plane 116, third insulating material layer 118, external adhesion strips 120, ground plane isolation gaps 122, and internal connection layers 124. Via barrel bonds include conductive pad metal-to-metal bonds 126 and internal metal-to-metal bonds 128. First ground plane 112 is embedded between first layer 110 and second layer 114, and second ground plane 116 is embedded between second layer 114 and third layer 118. First ground plane 112 and second ground plane 116 are separated from plated barrel 102 by ground plane isolation gaps 122 and internal connection layers 124, where internal connection layers 124 are between ground plane isolation gaps 122 and plated barrel 102. This isolates plated barrel 102 from ground planes 112 and 116.

Pursuant to this embodiment, plated barrel 102 is located within through-hole 100 and is attached to multilayer printed circuit board 22 from the top of first layer 110 to the bottom of third layer 118 with metalized polymer bonds, excluding the portions about the middle of multilayer printed circuit board 106 that have internal metal-to-metal bonds 128. Conductive pads 104 extend radially from the ends of plated barrel 102 to provide a longer leak path. Conductive pads 104 attach to external adhesion strips 120 of about equal radial dimension that are located on the edges of the outer layers of the multilayer circuit board 106 near plated barrel 102. Conductive pads 104 attach to external adhesion strips 120 using metal-to-metal bonds.

Via 30 has a longer leak path than the prior art, making it less likely for a leak to form. Additionally, conductive pad metal-to-metal bonds 126, and internal metal-to metal bonds 128 not only add to the leak path length, but provide stronger bonds than standard via structures. The stronger bonds prevent lifting of via 30 during thermal cycling. This was made possible by moving ground plane isolation gaps (annular rings) 122 away from plated barrel 102 and including internal connection layers 124. Isolation gaps 122 allow plated barrel 102 to be isolated from the electrical ground planes 112 and 114 of multilayer printed circuit board 106. The addition of a second ground plane adds no additional costs.

Via 30 constructed using the design set forth above has numerous advantages. First, it decreases the likelihood of leaks forming around through-hole 100, both on initial assembly and after extensive thermal cycling because of the increase in metal-to-metal bonds. Via 30 constructed using the design set forth above have been shown to meet thermal cycling of over 4000 cycles with no leaks around the vias when cycled between -50 degrees Celsius and 110 degrees Celsius.

Figure 4B:
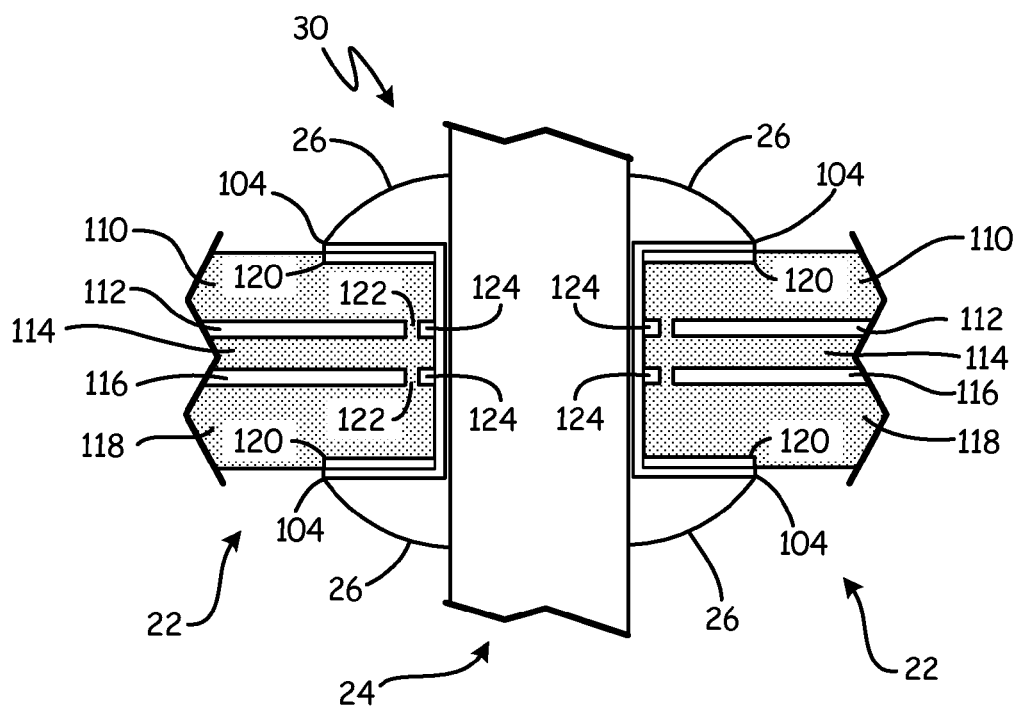
FIG. 4B is a cross-sectional view showing the via with a conductor pin inserted and soldered in place.

FIG. 4B shows conductor pin 24 placed in via 30 so that it extends from both sides of via 30 and is sealed into place with solder joints 26 on both sides of multilayer printed circuit board 22. Alternatively, some vias 30 can be completely sealed with solder.

Various additional embodiments of the present invention also include utilizing different anchoring techniques to attach seal board 14 to housing 12. Further, different seals can be used in place of O-ring 28, such as a radial seal or a custom rubber flat gasket.

While embodiments of the present invention have generally been described with respect to industrial process devices, embodiments of the present invention are also applicable to devices in the automotive and telecommunications industries and any other electrical device with electrical connections are made between multiple compartments.

Further, the embodiment of the present invention can be used in accordance with numerous design variations, such as separable connectors to one or both sides of the printed circuit board, wires attached on one or both sides of circuit board assembly 22 for permanent electrical connections, solid or stranded wires can be used as conductor pins 24, and pins can be epoxied or molded into place rather than using the circuit board.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A seal board comprising:
   a circuit board comprising:
      a first side;
      a second side opposite the first side;
      a plurality of vias; and
      a plurality of apertures in a periphery region of the circuit board to accept a plurality of fasteners;
   a plurality of conductor pins;
   a plurality of solder joints that connect and seal each conductor pin to a single via such that each conductor pin extends through the via and extends from the first side of the circuit board and the second side of the circuit board; and
   a seal in contact with the first side of the circuit board assembly, wherein the seal is does not extend into the periphery region of the circuit board.

2. The seal board of claim 1, further comprising:
   a plurality of chip capacitors attached to the first or second side of the circuit board to provide reduced electromagnetic interference (EMI) reduction.

3. The seal board of claim 1, wherein the via is sealed with a solder.

4. The seal board of claim 1, wherein the circuit board further comprises:
   a plurality of insulating material layers;
   an internal connection layer surrounded by at least one of the plurality of insulating material layers, the internal connection layer being electrically conductive;
   an external adhesion strip surrounding an outer end of the via; and
   a first embedded ground plane between two of the plurality of insulating material layers, the first embedded ground plane being electronically isolated from each via by the two insulating material layers.

5. The seal board of claim 4, further comprising:
   a second embedded ground plane between two of the plurality of insulating material layers and parallel to the first embedded ground plane, the second embedded ground plane being electrically isolated from each via by the two insulating material layers.

6. The seal board of claim 4, wherein each via comprises:
   a plated barrel connected to the internal connection layer of the circuit board with a metal-to-metal bond, the plated barrel separated from the first embedded ground plane by a ground plane isolation gap and the internal connection layer; and
   a conductive pad that extends from the plated barrel and overlays the external adhesion strip.

7. A transmitter comprising:
   a housing comprising:
      a first compartment;
      a second compartment;
      a bulkhead separating the first and second compartments in the housing; and
      an opening in the bulkhead between the first and second compartments; and
   a seal board covering the opening in the bulkhead, and sealing the second compartment from the first compartment, the seal board comprising:
      a circuit board comprising:
         a first side facing the first compartment;
         a second side facing the second compartment and opposite the first side; and
         a plurality of vias, the plurality of vias extending through at least one of the first and second sides of the circuit board;
      a plurality of conductor pins, each conductor pin having a first end extending from the first side of the circuit board into the first compartment through one of the plurality of vias, and a second end extending from the second side of the circuit board into the second compartment through one of the plurality of vias;
      a plurality of solder joints that connect and seal each conductor pin to a single via such that each conductor pin extends through the via and provides an electrical path between the first and second compartments; and
      an adapter fitting adjacent the first side of the circuit board for guiding the first ends of the conductor pins into engagement with a component housed within the first compartment.

8. The transmitter of claim 7, wherein the circuit board further comprises:
   a plurality of anchor holes in the perimeter of the circuit board at locations corresponding to a plurality of mating holes in the bulkhead, for receiving fasteners that extend through the plurality of anchor holes in the perimeter of the circuit board to connect the circuit board to the bulkhead.

9. The transmitter of claim 7, further comprising:
   a seal compressed between the bulkhead and the first side of the circuit board.

10. The transmitter of claim 7, wherein the first compartment is a terminal block compartment and the second compartment is a feature board compartment.

11. The transmitter of claim 10, further comprising:
    a plurality of chip capacitors attached to a surface of the circuit board and connected to the conductor pins to filter EMI.

12. The transmitter of claim 10, wherein the circuit board further comprises:
    a plurality of insulating material layers;
    an internal connection layer surrounded by at least one of the plurality of insulating material layers, the internal connection layer being electrically conductive; and
    a first embedded ground plane between two of the plurality of insulating material layers, the first embedded ground plane isolated from each via and from the internal connection layer by the two insulating material layers.

13. The transmitter of claim 12, wherein the circuit board further comprises:
    a second embedded ground plane between two of the plurality of insulating material layers and parallel to the first embedded ground plane, the second embedded ground plane being electrically isolated from each via and the internal connection layer by the two insulating material layers.

14. A transmitter comprising:
    a housing comprising:
       a first compartment;
       a second compartment;
       a bulkhead separating the first and second compartments in the housing; and
       an opening in the bulkhead between the first and second compartments; and a seal board covering the opening in the bulkhead, and sealing the second compartment from the first compartment, the seal board comprising:
a circuit board comprising:
a first side facing the first compartment;
a second side facing the second compartment and opposite the first side;
a plurality of insulating material layers;
an internal connection layer surrounded by at least one of the plurality of insulating material layers, the internal connection layer being electrically conductive; and
a first embedded ground plane between two of the plurality of insulating material layers, the first embedded ground plane isolated from the internal connection layer by the two insulating material layers;
a plurality of vias, the plurality of vias extending through at least one of the first and second sides of the circuit board, wherein each via comprises a plated barrel connected to the internal connection layer of the circuit board with a metal-to-metal bond; and a conductive pad that extends radially outward from the plated barrel, each via isolated from the first embedded ground plane by at least one of the plurality of insulating material layers;
a plurality of conductor pins, each conductor pin having a first end extending from the first side of the circuit board into the first compartment through one of the plurality of vias, and a second end extending from the second side of the circuit board into the second compartment through one of the plurality of vias;
a plurality of solder joints that connect and seal each conductor pin to a single via such that each conductor pin extends through the via and provides an electrical path between the first and second compartments.

15. The transmitter of claim 14, wherein the circuit board includes an external adhesion strip surrounding each via, and wherein the conductive pads overlay and are bonded to the adhesion strips.

16. A seal board comprising:
a circuit board comprising:
a first side;
a second side opposite the first side;
a plurality of vias, wherein each via comprises a plated barrel connected to the internal connection layer of the circuit board with a metal-to-metal bond, the plated barrel separated from the first embedded ground plane by a ground plane isolation gap and the internal connection layer, and a conductive pad that extends from the plated barrel and overlays the external adhesion strip; and
a plurality of conductor pins;
a plurality of solder joints that connect and seal each conductor pin to a single via such that each conductor pin extends through the via and extends from the first side of the circuit board and the second side of the circuit board;
a plurality of insulating material layers;
an internal connection layer surrounded by at least one of the plurality of insulating material layers, the internal connection layer being electrically conductive;
an external adhesion strip surrounding an outer end of the via; and
a first embedded ground plane between two of the plurality of insulating material layers, the first embedded ground plane being electronically isolated from each via by the two insulating material layers.

* * * * *